United States Patent [19]

Endler et al.

[11] 4,255,206

[45] Mar. 10, 1981

[54] METHOD FOR MANUFACTURING A SEMICONDUCTOR STRUCTURE

[75] Inventors: Wolfgang Endler, Munich; Karl-Heinz Zschauer, Grafing, both of Fed. Rep. of Germany

[73] Assignee: Siemens Aktiengesellschaft, Munich, Fed. Rep. of Germany

[21] Appl. No.: 970,177

[22] Filed: Dec. 18, 1978

[30] Foreign Application Priority Data

Dec. 22, 1977 [DE] Fed. Rep. of Germany ....... 2757470

[51] Int. Cl.³ .......................................... H01L 21/208
[52] U.S. Cl. ..................................... 148/171; 148/172
[58] Field of Search ................. 148/171, 172, 1.5, 175, 148/33

[56] References Cited

U.S. PATENT DOCUMENTS

| | | | |
|---|---|---|---|
| 3,824,493 | 7/1974 | Hakki | 148/171 X |
| 3,993,963 | 11/1976 | Logan et al. | 148/172 |
| 4,033,796 | 7/1977 | Burnham et al. | 148/171 X |
| 4,077,817 | 3/1978 | Bellavance | 148/171 |

*Primary Examiner*—G. Ozaki
*Attorney, Agent, or Firm*—Kenyon & Kenyon

[57] ABSTRACT

A method for manufacturing a semiconductor structure, especially for optoelectronic components, in which, at least one layer of a further semiconductor compound is deposited epitaxially on a substrate of a semiconductor compound. The surface of the substrate is provided with a multiplicity of bevelled structures of the further semiconductor compound. Prior to deposition, the surface of the substrate is provided with a multiplicity of mesas in a predetermined distribution, from each of which a bevelled structure is then generated. The plane and fault-free crystal surface of the bevels is preserved when further layers are deposited. The method is especially well suited for the manufacture of optoelectronic and microwave components.

7 Claims, 3 Drawing Figures

METHOD FOR MANUFACTURING A SEMICONDUCTOR STRUCTURE

BACKGROUND OF THE INVENTION (a) Field of the Invention

This invention relates to a method for manufacturing a semiconductor structure, useful, in particular, for optoelectronic components, in which a substrate of a single-crystal semiconductor compound is provided with at least one layer of a further semiconductor compound by epitaxial deposition.

(b) Description of the Prior Art

It is well known that the conductive properties of a light-emitting layer in optoelectronic components can be improved if the layer is incorporated between mixed crystals having a different index of refraction. With such heterostructures, the losses can be so limited that threshold current densities of about $10^3$ A/cm$^2$ are sufficient. The thickness of the active zone should not substantially exceed 1 $\mu$m and should preferably be substantially less than 1 $\mu$m, particularly 0.2 $\mu$m or less. In these components, a substrate of a semiconductor compound is therefore provided, by epitaxial deposition, with further layers of the same semiconductor compound or of another semiconductor compound, such as a mixed crystal (solid solution) with approximately the same lattice constant, which forms a heterojunction. Thus, to improve properties of semiconductor lasers, such as threshold current and resonator geometry, and to limit losses, thin layers with uniform layer height and a plane surface without crystal faults are required.

This requirement must also be met in the manufacture of other electronic coponents in which thin layers of compound semiconductors are produced by epitaxial deposition such as electronic components using the avalanche effect and avalanche transit time diodes. These diodes contain a rectifying junction which is operated in the cutoff direction and have an efficiency which is essentially determined by the breakthrough behavior of the pn junction and thereby, by the homogeneity of the breakthrough region. The requirements mentioned above must also be met in the manufacture of microwave field effect transistors in which an intermediate layer serving as a diffusion barrier is deposited on a substrate of a compound semiconductor, e.g., chromium-doped gallium arsenide, followed by an active, n-conduction epitaxial layer. The electrodes are then applied to the active layer.

It is therefore an object of this invention to provide a new and improved process for epitaxial deposition of at least one thin layer of uniform thickness without crystal faults on the surface of a compound semiconductor.

As is well known, small deviations from the uniform thickness of epitaxially deposited thin layers, especially from the liquid phase, can reduce the quality of the components produced. Epitaxial layers grown on a crystal surface having an orientation error $\alpha\phi$ of about 30 min, show the terrace structures of the grown layer. On the other hand, a flat and plane epitaxial layer is obtained if the orientation error of the substrate surface is less than 5 min (Journal of Crystal Growth, 27 (1974), pages 148 to 253). The mentioned requirements can therefore be met if the layers are grown on a perfectly plane surface of a substrate having single crystal surfaces without orientation errors. Such semiconductor surfaces, however, can be produced only with a very large effort.

It is further known that, in the case of lasers having a layer sequence of semiconductor compounds with double-hetero structure, the growth terraces caused by random orientation faults of the substrate surface increase light losses due to scattering and the effectiveness of the active volume of the layers is reduced due to the corresponding variations of the layer thickness, contributing to an increase of the threshold voltage (Journal of Applied Physics, vol. 47, no. 9, September 1976, pages 3992 to 4005).

SUMMARY OF THE INVENTION

The present invention is based on the discovery that the requirements mentioned above as to the structure of the thin epitaxial layers can be met in a simple manner if the epitaxial layer is formed on the substrate as a growth terrace which is closed in itself and thereby forms a so-called facet or bevel, it having been discovered that the surface of the bevels is approximately single-crystal and plane. In addition, the bevel structure is very stable, i.e., the bevel-like surface is preserved if a further layer is deposited.

In accordance with the invention, the surface of the substrate is provided with a multiplicity of bevel structures of the semiconductor compound having a predetermined distribution. The bevel structures are preferably obtained by first forming defined surface areas with different orientation errors and then utilizing the anisotropy of the crystal growth at the edges of the growth terraces, choosing a critical supersaturation range of the semiconductor compound to be deposited in which the anisotropy of the growth is enhanced.

These surface areas are obtained in a simple manner by providing the entire surface on which the following layer is to be subsequently deposited with a multiplicity of mesas having a predetermined distribution. The chosen distribution of the mesas is such that the entire arrangement can be divided after the double heterostructure is completed, so that each part produced contains one of the bevels. The mesas are made, for instance, by a photoresist technique with subsequent etching using the manufacturing process known in semiconductor technology as photolithography.

The semiconductor compound is preferably deposited on the surface of the substrate so prepared by liquid phase epitaxy with linear cooling down and at a low deposition rate. The deposition is preferably done from a solution of the semiconductor compound, the supersaturation of which at the start of the deposition at the phase boundary is not more than 3%, and, preferably, at most 1% and, in particular, not more than 0.3%. The cooling down rate will be at most 3° K./min and preferably at most 1° K./min, and in particular about 0.3° K./min.

The shape of the mesas is determined by the type of component being manufactured. They are preferably made as circular discs and may optionally also be square or rectangular. With these mesa shapes, the area of the cusps, i.e., the diameter or the side length of the cusps, will not substantially exceed several mm and will preferably be up to 1200 $\mu$m, and in particular about 200 to 500 $\mu$m. With these mesa cusps, one obtains, due to the anisotropic growth of the epitaxially grown layer, bevels having diameters which can be up to twice the diameter of the corresponding mesa and more.

With a predetermined choice of the position orientation of elongated structures, areas of larger dimensions, for instance of elongated shape, are also possible.

DETAILED DESCRIPTION OF THE INVENTION

Figure 1:
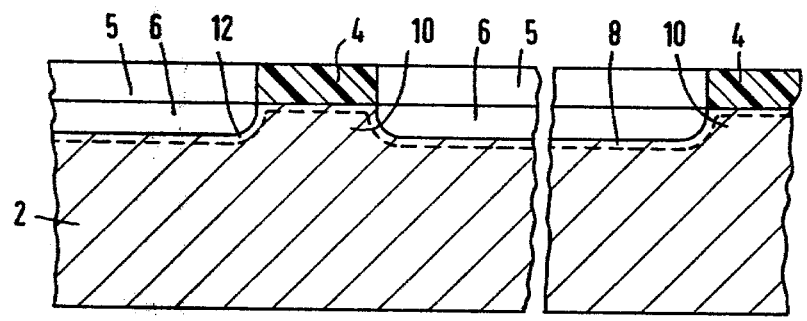
FIG. 1 is a diagrammatic illustration of the effect of succeeding process steps for manufacturing a semiconductor structure in accordance with the teachings of the invention.

Reference is made to FIG. 1 in which a substrate 2 of a semiconductor compound, e.g., n-conducting GaAs, is provided on its upper flat side with a layer 4 of photoresist. Portions 5 of photoresist layer 4 are removed in a manner well known in the art so that empty spaces are generated in the layer 4. A part 6 of the surface layer of the substrate 2 is subsequently removed through these empty spaces, for instance, by etching. Then, the remaining portions of layer 4 of the photoresist layer are removed, exposing mesas 10 on the surface of the substrate 2; the mesas may be distributed over the entire surface of the substrate, preferably in raster form. This distribution facilitates the later separation of the structure into individual parts each having a single mesa and further epitaxial layers deposited thereon. In some cases it has been found advantageous to subject the exposed surface of the substrate 2 to a subsequent etching process, whereby the corners at the upper flat sides of the mesas 10 are rounded somewhat; through this overall etching, a further thin surface layer 12 is removed from the substrate 2. The substrate 2 then takes the shape indicated by the dashed line in FIG. 1.

Figure 2:
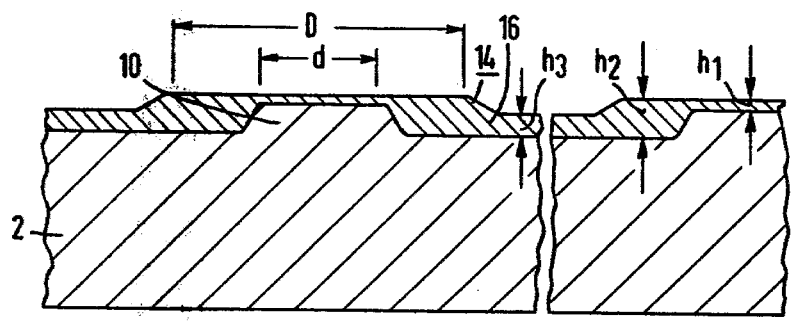
FIG. 2 shows an epitaxial layer produced on a substrate by the method of the invention.

On such a surface of the substrate 2, further epitaxial layers can be deposited without further preparation. As shown in FIG. 2, the substrate 2 is covered with an epitaxial layer 16 of a semiconductor compound, for instance, n-conduction (GaAl)As, which forms a heterojunction with the substrate. This epitaxial layer 16 is preferably obtained by liquid phase epitaxy with linear cooling down and a cooling rate of preferably about 0.3° K/min. After only a few seconds, small bevels are formed on the circular mesa 10 which increase with progressing growth far beyond the dimension d of the original mesa 10. Under a phase contrast microscope, the surface of the individual bevels appears completely smooth and exhibits practically no growth faults such as wetting faults. The bevel grows substantially more in the lateral direction than in the vertical direction. (For purposes of illustration, the vertical scale in FIG. 2 has been made about 25 times larger than the scale in the lateral direction.) The lateral growth rate exceeds the vertical growth rate by about two orders of magnitude. The growth on the bevel surface is inhibited in such a manner that the height of $h_1$ of the epitaxial layer on the mesa 10 is substantially smaller than the height $h_3$ of the epitaxial layer expected, according to diffusion theory, between the mesas 10. At the edges of the mesa 10, the epitaxial layer 16 grows to the height $h_2$. As soon as the height $h_2$ is reached, further growth in the vertical direction takes place only at a substantially reduced rate, so that toward the end of the deposition process, a bevel 14 has been formed, the upper flat side of which is plane and is formed by a single crystal surface. For instance, when a bevel 14 is grown, one obtains, after a growing time of about 20 min, a bevel 14 with a diameter D of about 600 μm on a mesa 10 having a cusp diamter $d = 300$ μm with a layer about 1 μm thick ($h_1$) above the mesa 10 and with a thickness $h_2$ of the outer part of the bevel 14 of about 4.5 μm and a height $h_3$ of the epitaxial layer between the bevels 14 of about 2.5 μm. This anisotropic growth of the epitaxial layer 16 which is required for the formation of the bevel 14 is obtained with a very slight supersaturation of the liquid phase of the semiconductor compound.

Figure 3:
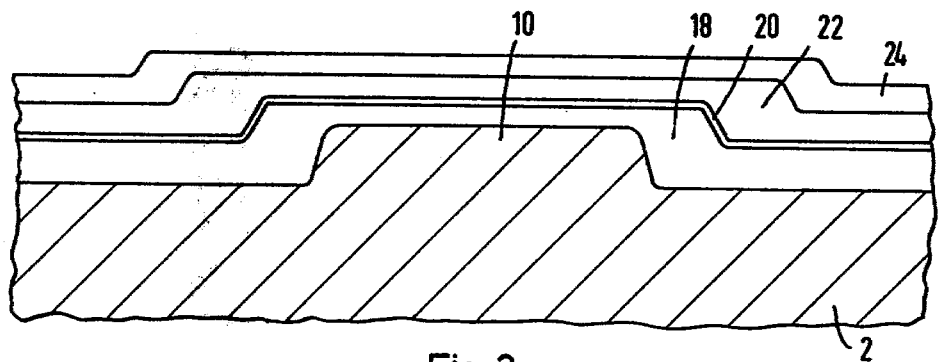
FIG. 3 shows a view in cross section of a semiconductor structure having a sequence of epitaxial layers made by the method of the invention.

If further layers are deposited, the shape of the bevel 14 is preserved, i.e., the bevel 14 continues to grow at a high lateral and a low vertical rate. Thus, multi-layer structures like that shown in FIG. 3 can be produced in a simple manner, for use, for instance, for GaAs laser diodes. In the embodiment of a laser diode with double heterostructure shown in FIG. 3, a substrate 2, for instance of n-conducting gallium arsenide, GaAs, is provided with a mesa 10. On the upper flat side of the substrate 2, a semiconductor compound of, for instance, n-conducting GaAlAs is deposited, which forms a heterojunction with the substrate 2. The deposition takes preferably place by liquid phase epitaxy with linear cooling down and very low supersaturation of the liquid semiconductor compound. The deposited epitaxial layer 18 forms a bevel with a substantially larger diameter than the mesa 10. For purposes of illustration, the lateral scale is also magnified in this figure about 25 times over the vertical scale.

A further layer 20 of p-conduction GaAlAs is deposited on the epitaxial layer 18 which is very thin and will serve as the active layer of a laser diode. On this active layer 20, a further layer 22 of p-conducting GaAlAs and thereon, again, an epitaxial layer 24 of p-conduction GaAs is deposited to form a heterojunction with the layer 22.

After the required multilayer structure is completed the starting structure for an individual component is obtained by separating the overall arrangement into individual parts, each of which contains a single bevel on the substrate 2. This division is indicated in the figure by the break lines at the lateral end faces. Liquid phase epitaxy is the preferred process for depositing the layer 18, 20, 22 and 24 of the multi-layer structure. However, the layers can also be deposited from the gaseous phase.

The method of the invention has been explained by way of its application to production of a multilayer structure for a GaAs laser diode. However, the method can be used for any components with epitaxially deposited layers in which an epitaxial layer free of crystal faults is required.

What is claimed is:

1. A method of manufacturing an array of subcomponents intended for subsequent processing and division into individual semiconductor components each having a single mesa of semiconductor material on the flat surface of which a thin layer of semiconducting material of uniform thickness, substantially free of crystal faults, has been formed, comprising the steps of:

removing portions of the surface of a single-crystalline semiconductor substrate, which surface lies approximately parallel to a single-crystal face of the substrate, in a grid-like pattern to form a plurality of plane-topped mesas the superficial extent of the top of each of which is not greater than 1.2 mm in diameter, in the case of circular structures, and along a side, in the case of straight sided structures, etching the entire surface of the substrate including the mesas, depositing, by means of liquid-phase epitaxy from a solution of semiconductor compound the supersaturation of which is not more than 3% at the start of deposition, a semiconductor layer on the entire etched surface, the layer being approximately 1 μm in thickness on the plane-topped surface of the mesa.

2. The method of claim 1 in which deposition is made from a solution of the semiconductor compound, the supersaturation of which, at the start of the deposition at the phase boundary, is at most 1%.

3. The method of claim 1 in which deposition is made from a solution of the semiconductor compound, the supersaturation of which, at the start of the deposition at the phase boundary, is at most 0.3%.

4. The method in accordance with claim 1 in which the cooling rate is at most 1° K./min.

5. The method in accordance with claim 1 in which the cooling rate is about 0.3° K./min.

6. The method of claim 1 further comprising the step of:

dividing the substrate and the deposited semi-conductor layer into semi-conductor components each of which has only one mesa.

7. The method in accordance with one of the claims 1, 2, 3, 4, or 5 in which the superficial extent of the top of each plane-topped mesa is between 200 and 500 micrometers.

* * * * *